(12) United States Patent
Adetutu et al.

(10) Patent No.: US 6,987,063 B2
(45) Date of Patent: Jan. 17, 2006

(54) METHOD TO REDUCE IMPURITY ELEMENTS DURING SEMICONDUCTOR FILM DEPOSITION

(75) Inventors: Olubunmi O. Adetutu, Austin, TX (US); James K. Schaeffer, Austin, TX (US); Dina H. Triyoso, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 20 days.

(21) Appl. No.: 10/865,452

(22) Filed: Jun. 10, 2004

(65) Prior Publication Data

US 2005/0277296 A1 Dec. 15, 2005

(51) Int. Cl.
*H01L 21/44* (2006.01)

(52) U.S. Cl. .......... 438/685; 438/681; 438/763; 438/785; 438/240; 438/625; 438/677; 438/783; 438/754; 171/93; 171/84; 171/89; 427/248.1; 427/252; 427/255.31; 427/255.36; 427/343

(58) Field of Classification Search ........... 438/685, 438/681, 763, 785, 240, 625, 677, 754; 171/93, 171/84, 89; 427/248.1, 252, 255.31, 255.36, 427/343
See application file for complete search history.

(56) References Cited

U.S. PATENT DOCUMENTS

| 6,200,893 | B1 * | 3/2001 | Sneh ........................ 438/685 |
| 6,270,572 | B1 * | 8/2001 | Kim et al. .................. 117/93 |
| 6,468,924 | B2 * | 10/2002 | Lee et al. ................. 438/763 |
| 6,576,053 | B1 * | 6/2003 | Kim et al. .................. 117/89 |
| 6,869,638 | B2 * | 3/2005 | Baum et al. ............. 427/126.1 |
| 2003/0003230 | A1 * | 1/2003 | Kim et al. ............ 427/255.394 |
| 2003/0234417 | A1 * | 12/2003 | Raaijmakers et al. ....... 257/309 |
| 2004/0043557 | A1 * | 3/2004 | Haukka et al. ............. 438/240 |
| 2004/0168627 | A1 * | 9/2004 | Conley et al. ................ 117/89 |
| 2004/0261692 | A1 * | 12/2004 | Dwilinski et al. ............ 117/84 |
| 2005/0012089 | A1 * | 1/2005 | Senzaki et al. ............... 257/40 |

(Continued)

FOREIGN PATENT DOCUMENTS

| WO | WO 2004/008827 A2 | 1/2004 |
| WO | WO 2004/017377 A3 | 2/2004 |
| WO | WO 2004/041753 A2 | 5/2004 |

OTHER PUBLICATIONS

Nigro, Raffaella Lo et al.; "Fabrication of $LaAlO_3/Pt(100)/$ Hastelloy C276 and $CeO_2(100)/Pt(100)$Hastelloy C276 Multilayers by Metallorganic Chemical Vapor Deposition", Journal of The Electrochemical Society; Jun. 29, 2001; pp F159-F163; vol. 148 (8).

(Continued)

*Primary Examiner*—David Zarneke
*Assistant Examiner*—Victor V. Yevsikov
(74) *Attorney, Agent, or Firm*—Robert L. King; Joanna G. Chiu

(57) ABSTRACT

A metal-containing semiconductor layer having a high dielectric constant is formed with a method that avoids inclusion of contaminant elements that reduce dielectric constant of metals. The metal-containing semiconductor layer is formed overlying a substrate in a chamber. A precursor is introduced to deposit at least a portion of the metal-containing semiconductor layer. The precursor contains one or more elements that, if allowed to deposit in the metal-containing layer, would become impurity elements. A reactant gas is used to purify the metal-containing layer by removing impurity elements from the metal-containing layer which were introduced into the chamber by the precursor.

32 Claims, 3 Drawing Sheets

U.S. PATENT DOCUMENTS

2005/0070126 A1 * 3/2005 Senzaki ...................... 438/785

OTHER PUBLICATIONS

Gordon, Roy G. et al.; "Alternating Layer Chemical Vapor Deposition (ALD) of Metal Silicates and Oxides for Gate Insulators"; Mat. Res. Soc. Symp. Proc.; 2001; pp 2.4.1-2.4.6; vol. 670.

Innertsberger, G. e al.; "The Influence of Flourine on Various MOS Devices"; Mat. Res. Soc. Symp. Proc.; 1999; pp 589-595; vol. 567.

Ritala, Mikko et al.; "Atomic Layer Deposition"; Handbook of Thin Film Materials, Chapter 2; 2002; pp 103-159; vol. 1: Deposition and Processing of Thin Films; Academic Press.

* cited by examiner

METHOD TO REDUCE IMPURITY ELEMENTS DURING SEMICONDUCTOR FILM DEPOSITION

FIELD OF THE INVENTION

This invention relates generally to methods of manufacturing semiconductors, and more specifically, to methods of forming films for semiconductor devices.

BACKGROUND OF THE INVENTION

Future generation semiconductor devices will require thin gate dielectric films having a high dielectric constant and thin metallic films, both films having high purity. Such films are commonly formed using a variety of well documented techniques. However, conventional techniques used to form thin films have typically introduced impurity elements that lower the dielectric constant of the film and degrade the electrical properties of the film material.

In U.S. Patent Application No. 2004008827 entitled "Atomic Layer Deposition of High K Dielectric Films" by Lee et al., a method is discussed to provide a dielectric film by using two portions. A first portion contains silicon dioxide that is pretreated in order to obtain a thin layer. Silicon dioxide has a relatively low dielectric constant of about 3.9. Therefore a portion of the silicon dioxide is removed by a reactive gas in order to obtain a higher dielectric constant for the dielectric stack (the silicon dioxide and the subsequent metal oxide). Various known etchants, including fluorine and chlorine based chemistries, are disclosed to accomplish this removal of silicon dioxide. A second portion of the dielectric film is subsequently formed by atomic layer deposition (ALD) on top of the thin portion of silicon dioxide. However, regardless of which of the disclosed metal oxides is used, the second portion of the dielectric film contains contaminants such as at least one of carbon, nitrogen and silicon. Depending upon which contaminant is present, each of the contaminants functions to significantly degrade various electrical characteristics of the film or to lower the dielectric constant of the film. For example, if silicon is present in the metal oxide, the dielectric constant of the film is lowered. If carbon is present in the metal oxide, the current or gate leakage is increased and the reliability is degraded.

In an article by Gordon et al., entitled "Alternating Layer Chemical Vapor Deposition (ALD) of Metal Silicates and Oxides for Gate Insulators" in the Mat. Res. Soc. Symp. Proc. Vol. 670 of the 2001 Materials Research Society, there is disclosed a method for forming a "pure" metal oxide as an alternative to forming a metal silicate that uses both a silicon precursor and a metal precursor. The metal oxide is described as being formed by using only a metal precursor. However, the metal precursor described therein has both nitrogen and carbon. The ramification of using such a precursor is that the carbon and nitrogen from the precursor are incorporated in the "pure" metal oxide film as impurities. These impurities degrade the electrical characteristics of the resulting metal oxide film.

In an article by Lo Nigro et al. entitled "Fabrication of LaAlO3/Pt(100)/Hastelloy C276 and CeO2(100)/Pt(100)/Hastelloy C276 Multilayers by Metallorganic Chemical Vapor Deposition", Journal of the Electrochemical Society, 148 (8) F159–F163 (2001), there is described a method of forming a semiconductor thin film. The film is formed by a precursor that contains fluorine for the purpose of delivering the precursor into a reaction chamber. The fluorination of the precursor assists in delivery of the precursor. However, metal oxide made by this method contains precursor impurities including fluorine and carbon. Because fluorine is present in the precursor as part of the ligand of the precursor, an undesired amount of the fluorine is deposited in the thin film.

BRIEF DESCRIPTION OF THE DRAWINGS

The present invention is illustrated by way of example and not limitation in the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
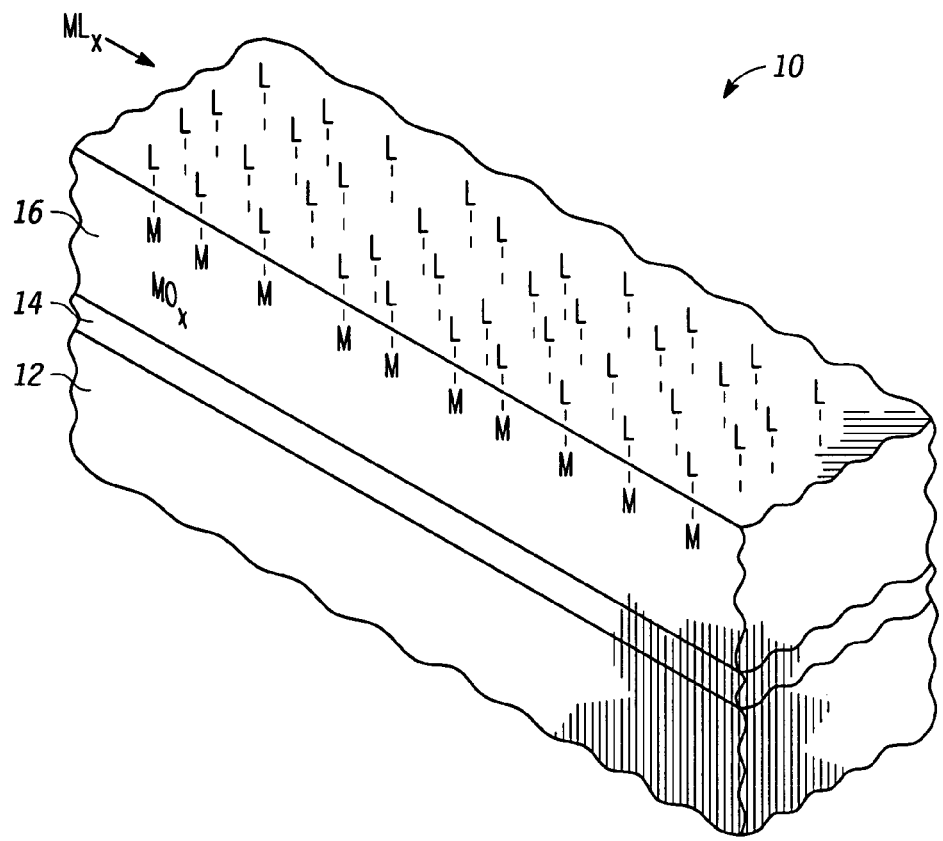
FIG. 1 illustrates a perspective view of a semiconductor device being processed in accordance with one form of the methods taught herein.

Illustrated in FIG. 1 is a semiconductor device 10 in which a thin film having a high dielectric constant is formed. A substrate 12 is provided. In one form substrate 12 is a bulk semiconductor such as silicon or silicon germanium, but any of various semiconductor materials may be used to implement substrate 12. Alternatively, substrate 12 may be implemented as a silicon-on-insulator (SOI) substrate. Overlying substrate 12 is a thin silicon dioxide dielectric layer 14. In one form, the thin silicon dioxide dielectric layer 14 is formed by the chemical cleaning of the silicon substrate 12 which results in a chemical oxide or a native oxide formed on the silicon substrate 12. Other conventional forms of formation may be used such as thermal growth. It should be noted that the thickness of silicon dioxide dielectric layer 14, while thin, is desired to have a minimal desired thickness in order to have good electron and hole mobility through a transistor channel where the silicon dioxide dielectric layer 14 functions as part of the transistor's gate dielectric. The methods described herein therefore permit the silicon dioxide dielectric layer 14 to be formed having a desired optimal thickness while still obtaining the desired electrical characteristics of the resulting metal oxide layer to be formed.

Overlying the thin silicon dioxide dielectric layer 14 is a metal oxide layer 16 formed by various deposition techniques. In one form, ALD (atomic layer deposition) may be used to form the metal oxide layer 16. As illustrated in FIG. 1, the metal oxide layer 16 is formed of multiple atomic layers. Assume for purposes of explanation that a plurality of previously formed atomic layers has occurred. The explanation herein will describe the formation of an uppermost atomic layer of metal oxide layer 16. The metal oxide layer 16 may be formed of any of various suitable metals, M, to form a composition of $MO_x$, where x may be any integer value depending upon the oxidation state of the particular metal M. ALD is a cyclical process that depends on alternating chemical reactions between a metal precursor and an oxidizing species. The metal precursors described above typically contain a metal which is a primary constituent in the deposited film and surrounding ligand groups. Some commonly used ligand groups include: halides, alkoxides, acetylacetonates, nitrates, and alkylamides. Compounds with a mixture of ligands have also been synthesized. It should be apparent that to initiate the ALD reaction a hydroxyl (OH)-terminated surface, in one form, is an ideal surface condition prior to introducing a metal precursor.

The semiconductor device 10 is placed in a conventional processing chamber (not shown). While semiconductor device 10 is within the processing chamber, a metal precursor gas, $ML_x$, is introduced into the chamber and flows over the semiconductor device 10 with a hydroxyl termination as indicated by the arrow in FIG. 1 flowing across semiconductor device 10. In one form, an ALD reaction is implemented to make the metal oxide precursor react with the semiconductor device 10. The letter "L" used in the metal precursor symbol represents a ligand and contains at least one of silicon, Si, carbon, C, nitrogen, N, and other precursor species such hydrogen, H. The $ML_x$ species adsorbs on the surface of the substrate 12 in a manner such that a reaction occurs between $ML_x$ and pre-existing hydroxyl groups. Byproducts are generated from the reaction between $ML_x$ and pre-existing hydroxyl groups on the surface of the metal oxide layer 16 to form metal oxide film and a volatile HL byproduct. This reaction leaves the surface terminated with the ligand species. In this configuration, the metal M now becomes part of the underlying areas of metal oxide layer 16. It should also be understood that other deposition formation techniques may be used such as MOCVD (metal organic chemical vapor deposition). Various metals M may be used including hafnium, lanthanum, zirconium, yttrium, titanium, copper, gold and tantalum, Ru, Ir, Pd, Pt and other transition and rare earth metals.

Figure 2:
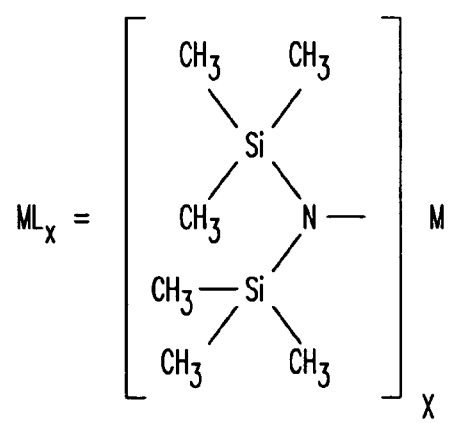
FIG. 2 illustrates an atomic configuration of one of numerous forms of a metal ligand for use with the methods taught herein.

Illustrated in FIG. 2 is an atomic configuration of one form of a metal precursor. The metal precursor has a formula of $ML_x$ where x is an integer. In one form of the metal precursor that would conventionally introduce silicon, nitrogen and carbon impurities when deposition occurs, the metal precursor of $M(N(Si(CH_3)_3)_2)_x$ is used. M is formed of any of the metals described above.

Figure 3:
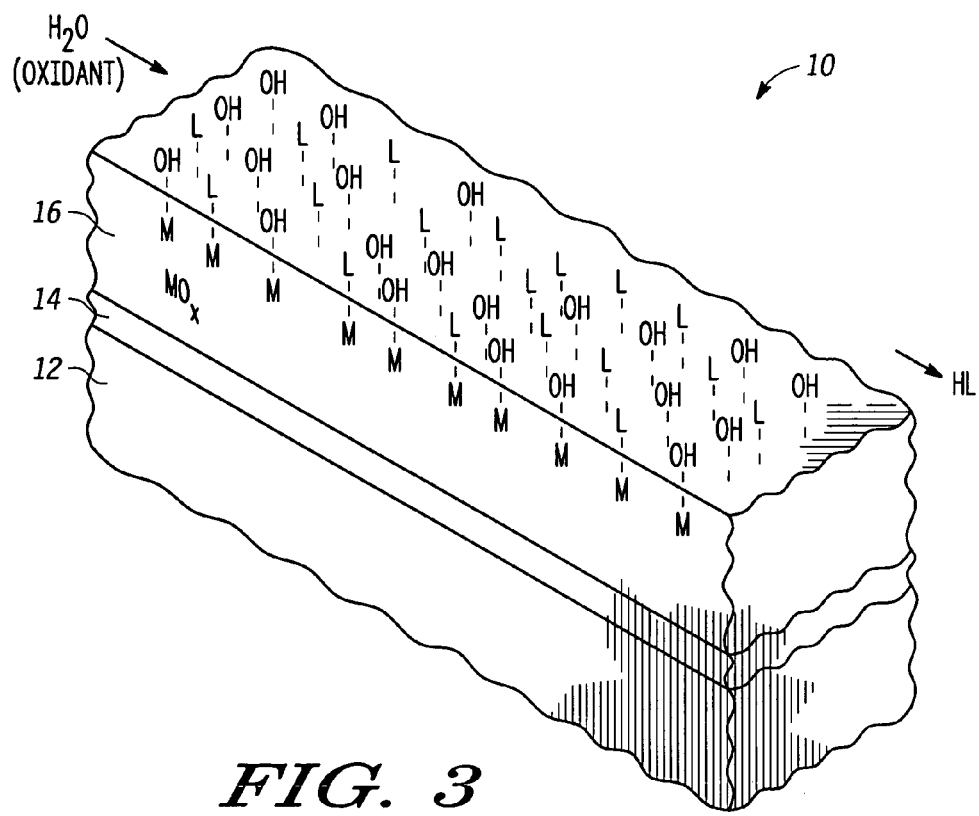
FIGS. 3–5 illustrate perspective views of the semiconductor device processed in accordance with one of the methods taught herein.

Illustrated in FIG. 3 is further processing of semiconductor device 10 in accordance with the methods described herein. In particular, subsequent to a chamber purge, water is used as an oxidant and is flowed into the reactor as indicated by the arrow in FIG. 3 next to the $H_2O$ label. The water reacts with a majority of the ligands to form a hydroxyl termination on the metal oxide surface of metal oxide layer 16. The ligands are removed from the chamber as a volatile HL byproduct as indicated in FIG. 3 by an arrow adjacent the HL label. However, some of the ligands remain unreacted on the metal oxide surface which will result in silicon, carbon and nitrogen contaminants in the metal oxide layer 16 if not removed.

Figure 4:
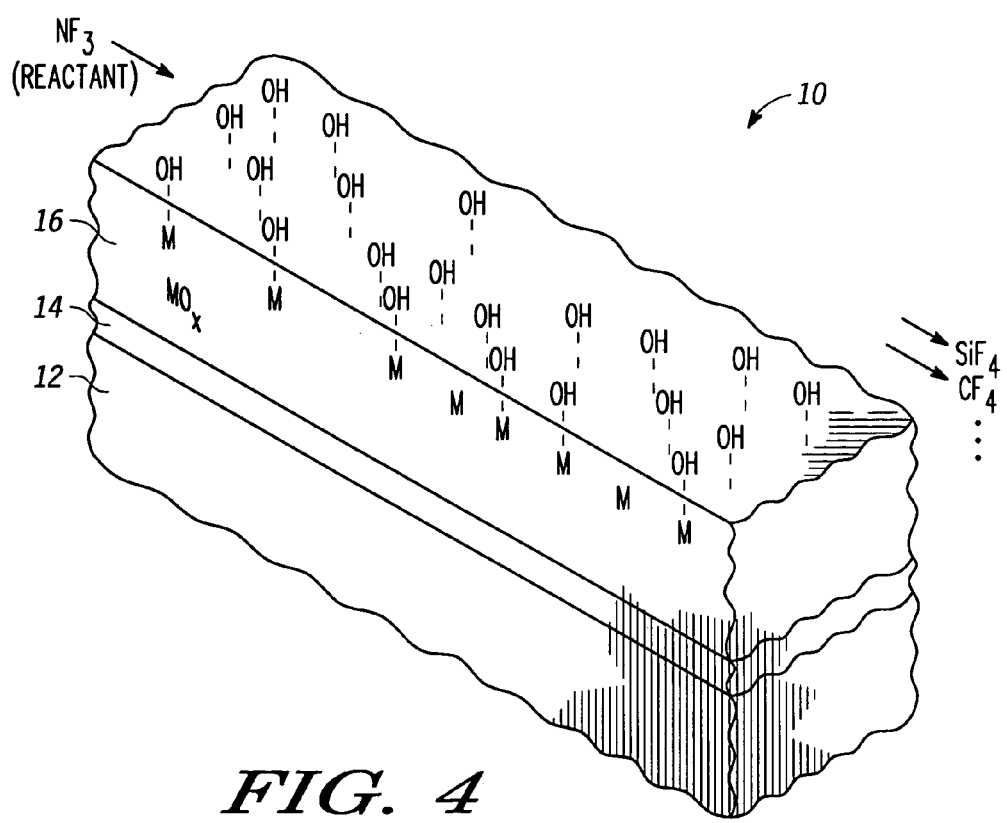

Illustrated in FIG. 4 is further processing of semiconductor device 10 in accordance with the methods described herein. In particular, a reactant gas species, containing fluorine or chlorine, such as $NF_3$ and others, is introduced into the chamber as indicated by the arrow across semiconductor device 10 in FIG. 4 and subsequent to a chamber purge. In other forms, the reactant may be implemented as either a solid or a liquid possessing sufficient vapor pressure so that it may be transported to the chamber as a vapor using a carrier gas. The reactant gas species reacts with the ligands to form volatile byproducts such as $SiF_4$ or $CF_4$ and other volatile byproducts depending upon the source materials. These volatile byproducts are purged from the reaction chamber as indicated by the arrows directed away from semiconductor device 10 in FIG. 4, thereby removing contaminants from the metal oxide layer 16 that would have otherwise lowered the dielectric constant or degrade various electrical properties of the metal oxide layer 16. As a result, the residual ligands have been removed and leave predominately hydroxyls on the surface of the metal oxide layer 16. At this point it may be desirable to purge the chamber and then perform another oxidation flow by introducing an oxidant, such as water, into the chamber. The additional optional oxidation flow results in significantly more hydroxyl groups on the surface of the metal oxide layer 16.

Figure 5:
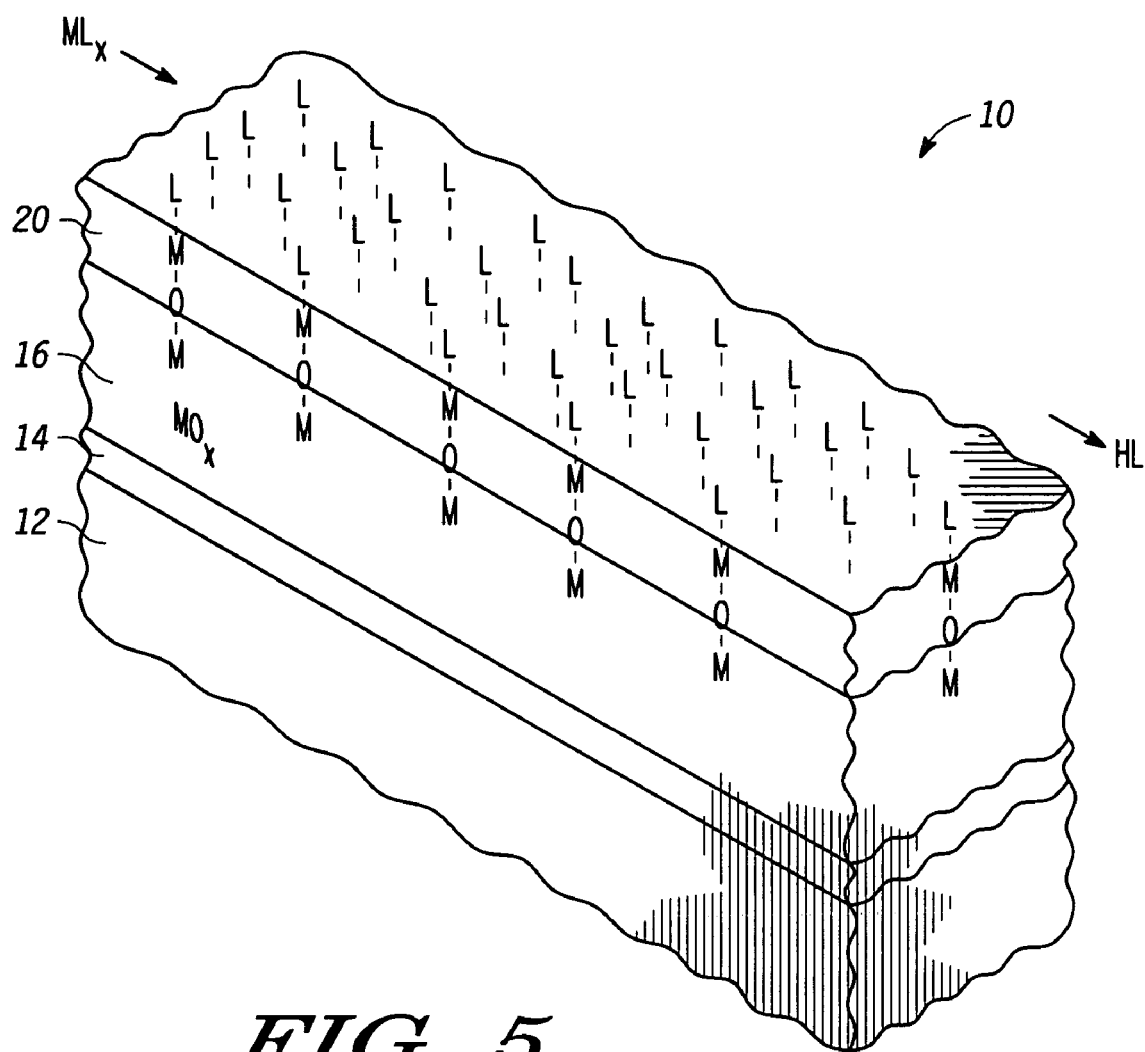

Illustrated in FIG. 5 is further processing of semiconductor device 10. The metal precursor $ML_x$, is again flowed over the semiconductor device 10. The metal precursor $ML_x$ reacts with the hydroxyl groups OH of FIG. 4 to form a volatile HL byproduct as illustrated in FIG. 5. The HL byproduct is removed away from the semiconductor device 10 and a single atomic metal layer 20 is formed. Therefore, this repetition of the method forms repetitive single atomic layers of metal oxide. The method may be repeated a desired number of times to create a composite metal oxide layer of desired thickness. Therefore metal oxide layer 16 is a composite of various discrete atomic layers such as metal oxide layer 20.

In an alternative form, an MOCVD method may be implemented. In the MOCVD process, the oxidizer, the precursor and the reactant may all be introduced into the processing chamber at substantially the same time. An advantage with this embodiment is that many of the contaminants contained within the precursor are reacted without first being deposited on the metal oxide layer 16. This processing is an advantage in the fact that such contaminants do not become part of the metal oxide layer 16 and therefore are not permitted to adversely affect the dielectric constant and other electrical properties of the metal oxide layer 16.

By now it should be appreciated that there has been provided methods for producing a semiconductor thin-film layer in a semiconductor device. The thin-film layer has high dielectric constant as a result of being formed of a material that contains a minimum of contaminant particles that negatively affect the electrical properties, including but not limited to dielectric constant. The thin-film layer contains substantially no silicon, carbon and nitrogen. In contrast, previous methods that claimed to form pure metal containing layers with high dielectric constants in fact did have silicon, carbon and other impurities in at least some portions of the layer.

In the foregoing specification, the invention has been described with reference to specific embodiments. However, one of ordinary skill in the art appreciates that various modifications and changes can be made without departing from the scope of the present invention as set forth in the claims below. For example, the methods described herein may be used to form either a thin-film metal as well as a metal oxide. Additionally, various contaminants other than silicon and carbon may be removed, including metals. The types of metals may be varied from that described above and the reactant chemistry may be varied. Various types of semiconductor processing chambers may be used. Additionally, other process steps may be performed which will result in even higher purity of the metal being deposited.

In one form there is provided a method for forming a metal-containing layer. A semiconductor substrate is provided. A precursor is introduced to deposit the metal-containing layer over the semiconductor substrate. The semiconductor substrate is exposed to a reactant to purify the metal-containing layer by reacting the reactant with impurity elements from the metal-containing layer to remove the impurity elements, wherein the impurity elements were introduced by the precursor. In one form the precursor is a metal element of the metal-containing layer and at least one impurity element. In another form the impurity element is at least one of silicon, nitrogen, or carbon. In one form the reactant is one of fluorine or chlorine. In another form the metal-containing layer is an element selected from a group consisting of hafnium, lanthanum, zirconium, yttrium, titanium, tantalum, Ru, Ir, Pd and Pt. In another form the metal-containing layer is further characterized as a metal oxide layer and is a material selected from a group of hafnium oxide, lanthanum oxide, zirconium oxide, yttrium oxide, tantalum oxide, and titanium oxide. In another form the reactant is one of fluorine or chlorine. In another form the semiconductor substrate is exposed to the reactant after introducing the precursor. In another form the precursor is introduced and the semiconductor substrate is exposed to the reactant at least partially simultaneously. In another form the precursor is introduced after exposing the semiconductor substrate to the reactant. In another form the precursor is introduced to deposit the at least a portion of the metal-containing layer over the semiconductor substrate as an atomic layer deposition (ALD) of the metal-containing layer. In another form the precursor is introduced to deposit the at least a portion of the metal-containing layer over the semiconductor substrate as a metal organic chemical vapor deposition (MOCVD) of the metal-containing layer. In another form the semiconductor substrate is introduced to the reactant to purify the metal-containing layer by removing impurity elements from the metal-containing layer which were introduced by the precursor further comprises removing impurity elements which have not deposited onto the semiconductor substrate. In another form an interfacial layer is formed over the semiconductor substrate, wherein the at least a portion of the metal-containing layer is deposited over the interfacial layer. In another form the semiconductor substrate is exposed to an oxidant, wherein the oxidant includes one of water ($H_2O$), deuterated water ($D_2O$), oxygen ($O_2$), or ozone ($O_3$). In another form the reactant that the semiconductor substrate 12 is exposed to is at least partially ionized. This partial ionization may be accomplished by applying either a direct or an indirect plasma on at least the reactant.

In yet another form there is provided a method for forming a metal-containing layer. A semiconductor substrate 12 is provided. A precursor is introduced to deposit at least a portion of the metal-containing layer over the semiconductor substrate. The semiconductor substrate is exposed to a reactant to purify the metal-containing layer by reacting the reactant with impurity elements to remove the impurity elements, wherein the impurity elements were introduced by the precursor and wherein the precursor does not include the reactant. In one form the removed impurity elements have not been deposited onto the semiconductor substrate. In another form the precursor is a metal element of the metal-containing layer and has at least one impurity element. In another form the impurity element is at least one of silicon, nitrogen, or carbon. In yet another form the reactant is one of fluorine or chlorine. In yet another form the metal-containing layer is an element selected from the group of hafnium, lanthanum, zirconium, yttrium, titanium, tantalum, Ru, Ir, Pd and Pt. In yet another form the metal-containing layer is a metal oxide layer and is a material selected from the group of hafnium oxide, lanthanum oxide, zirconium oxide, yttrium, tantalum oxide, and titanium oxide. In yet another form the reactant is one of fluorine or chlorine. In another form the precursor is introduced and the semiconductor substrate is exposed to the reactant at least partially simultaneously. In yet another form the precursor is introduced to deposit the at least a portion of the metal-containing layer over the semiconductor substrate as one of an atomic layer deposition (ALD) of the metal-containing layer or a metal organic chemical vapor deposition (MOCVD) of the metal-containing layer. In another form an interfacial layer is formed over the semiconductor substrate, wherein the at least a portion of the metal-containing layer is deposited over the interfacial layer. In another form the semiconductor substrate is exposed to an oxidant, wherein the oxidant includes one of water ($H_2O$), deuterated water ($D_2O$), oxygen ($O_2$), or ozone ($O_3$). In another form the reactant that the semiconductor substrate is exposed to is at least partially ionized.

In another form there is provided a method for forming a metal oxide layer including providing a semiconductor substrate. A precursor is introduced into a processing chamber to deposit a metal oxide layer over the semiconductor substrate, wherein the metal oxide layer includes one of hafnium oxide or lanthanum oxide. The semiconductor substrate is exposed to a reactant to purify the metal oxide layer by reacting the reactant with impurity elements from the metal oxide layer to remove the impurity elements, wherein the impurity elements were introduced by the precursor, and wherein the reactant includes one of fluorine or chlorine. In another form, after introducing the precursor and exposing the semiconductor substrate to the reactant, the metal oxide layer includes at most 5% of any impurity element. In yet another form the precursor is introduced and the semiconductor substrate is exposed to the reactant at least partially simultaneously.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. Accordingly, the specification and figures are to be regarded in an illustrative rather than a restrictive sense, and all such modifications are intended to be included within the scope of the present invention.

What is claimed is:

1. A method for forming a metal-containing layer, comprising:
   providing a semiconductor substrate;
   introducing a precursor to deposit the metal-containing layer over the semiconductor substrate; and
   exposing the semiconductor substrate to a reactant to purify the metal-containing layer by reacting the reactant with impurity elements from the metal-containing layer to remove the impurity elements, wherein the impurity elements were introduced by the precursor.

2. The method of claim 1, wherein the precursor comprises a metal element of the metal-containing layer and at least one impurity element.

3. The method of claim 2, wherein the impurity elements comprise at least one of silicon, nitrogen, or carbon.

4. The method of claim 3, wherein the reactant comprises one of fluorine or chlorine.

5. The method of claim 1, wherein the metal-containing layer comprises an element selected from a group consisting of hafnium, lanthanum, zirconium, yttrium, titanium, tantalum, Ru, Ir, Pd and Pt.

6. The method of claim 1, wherein the metal-containing layer is further characterized as a metal oxide layer and comprises a material selected from a group consisting of hafnium oxide, lanthanum oxide, zirconium oxide, yttrium oxide, tantalum oxide, and titanium oxide.

7. The method of claim 1, wherein the reactant comprises one of fluorine or chlorine.

8. The method of claim 1, wherein the semiconductor substrate is exposed to the reactant after introducing the precursor.

9. The method of claim 1, wherein introducing the precursor and exposing the semiconductor substrate to the reactant are performed at least partially simultaneously.

10. The method of claim 1, wherein the precursor is introduced after exposing the semiconductor substrate.

11. The method of claim 1, wherein introducing the precursor to deposit the metal-containing layer over the semiconductor substrate corresponds to an atomic layer deposition (ALD) of the metal-containing layer.

12. The method of claim 1, wherein introducing the precursor to deposit the metal-containing layer over the semiconductor substrate corresponds to a metal organic chemical vapor deposition (MOCVD) of the metal-containing layer.

13. The method of claim 1, wherein exposing the semiconductor substrate to the reactant to purify the metal-containing layer by removing impurity elements from the metal-containing layer which were introduced by the precursor further comprises removing impurity elements which have not deposited onto the semiconductor substrate.

14. The method of claim 1, further comprising:
forming an interfacial layer over the semiconductor substrate, wherein the metal-containing layer is deposited over the interfacial layer.

15. The method of claim 1, further comprising:
exposing the semiconductor substrate to an oxidant, wherein the oxidant includes one of water ($H_2O$), deuterated water ($D_2O$), oxygen ($O_2$), or ozone ($O_3$).

16. The method of claim 1, wherein the reactant that the semiconductor substrate is exposed to is at least partially ionized.

17. A method for forming a metal-containing layer, comprising:
providing a semiconductor substrate;
introducing a precursor to deposit the metal-containing layer over the semiconductor substrate; and
exposing the semiconductor substrate to a reactant to purify the metal-containing layer by reacting the reactant with impurity elements to remove the impurity elements, wherein the impurity elements were introduced by the precursor and wherein the precursor does not include the reactant.

18. The method of claim 17, wherein the impurity elements that are removed have not been deposited onto the semiconductor substrate.

19. The method of claim 17, wherein the precursor comprises a metal element of the metal-containing layer and at least one impurity element.

20. The method of claim 19, wherein the impurity elements comprise at least one of silicon, nitrogen, or carbon.

21. The method of claim 20, wherein the reactant comprises one of fluorine or chlorine.

22. The method of claim 17, wherein the metal-containing layer comprises an element selected from a group consisting of hafnium, lanthanum, zirconium, yttrium, titanium, tantalum, Ru, Ir, Pd and Pt.

23. The method of claim 17, wherein the metal-containing layer is further characterized as a metal oxide layer and comprises a material selected from a group consisting of hafnium oxide, lanthanum oxide, zirconium oxide, yttrium oxide, tantalum oxide, and titanium oxide.

24. The method of claim 17, wherein the reactant comprises one of fluorine or chlorine.

25. The method of claim 17, wherein introducing the precursor and exposing the semiconductor substrate to the reactant are performed at least partially simultaneously.

26. The method of claim 17, wherein introducing the precursor to deposit the metal-containing layer over the semiconductor substrate corresponds to one of an atomic layer deposition (ALD) of the metal-containing layer or to a metal organic chemical vapor deposition (MOCVD) of the metal-containing layer.

27. The method of claim 17, further comprising:
forming an interfacial layer over the semiconductor substrate, wherein the metal-containing layer is deposited over the interfacial layer.

28. The method of claim 17, further comprising:
exposing the semiconductor substrate to an oxidant, wherein the oxidant includes one of water ($H_2O$), deuterated water ($D_2O$), oxygen ($O_2$) or ozone ($O_3$).

29. The method of claim 17, wherein the reactant that the semiconductor substrate is exposed to is at least partially ionized.

30. A method for forming a metal oxide layer, comprising:
providing a semiconductor substrate;
introducing a precursor to deposit a metal oxide layer over the semiconductor substrate, wherein the metal oxide layer includes one of hafnium oxide or lanthanum oxide; and
exposing the semiconductor substrate to a reactant to purify the metal oxide layer by reacting the reactant with impurity elements from the metal oxide layer to remove the impurity elements, wherein the impurity elements were introduced by the precursor, and wherein the reactant includes one of fluorine or chlorine.

31. The method of claim 30, wherein after introducing the precursor and exposing the semiconductor substrate to the reactant, the metal oxide layer includes at most 5% of any impurity element.

32. The method of claim 30, wherein introducing the precursor and exposing the semiconductor substrate to the reactant are performed at least partially simultaneously.

* * * * *